United States Patent [19]

Arnold et al.

[11] Patent Number: 4,949,302

[45] Date of Patent: Aug. 14, 1990

[54] MESSAGE FILE FORMATION FOR COMPUTER PROGRAMS

[75] Inventors: Hugh H. Arnold; Thomas E. Hintz, both of Austin, Tex.

[73] Assignee: International Business Machines Corporation, Armonk, N.Y.

[21] Appl. No.: 931,109

[22] Filed: Nov. 17, 1986

[51] Int. Cl.⁵ .................... G06F 12/00; G06F 3/00

[52] U.S. Cl. ................ 364/900; 364/948.2; 364/943; 364/943.43; 364/920.4; 364/951.1; 364/951.3

[58] Field of Search ... 364/200 MS File, 900 MS File, 364/419, 300, 419, 200, 900, 300; 340/790

[56] References Cited

U.S. PATENT DOCUMENTS

| | | | |
|---|---|---|---|
| 3,670,310 | 6/1972 | Bharwani et al. | 364/200 |
| 3,717,851 | 2/1973 | Cocke et al. | 375/122 |
| 4,044,347 | 8/1977 | VanVoorhis | 341/67 |
| 4,232,375 | 11/1980 | Paugstat et al. | 364/900 |
| 4,355,306 | 10/1982 | Mitchell | 364/900 X |
| 4,358,824 | 11/1982 | Glickman et al. | 364/200 |
| 4,365,315 | 12/1982 | Jamnik | 364/900 |
| 4,386,416 | 5/1983 | Giltner et al. | 364/900 |
| 4,403,303 | 9/1983 | Howes et al. | 364/900 |
| 4,454,576 | 6/1984 | McInroy et al. | 364/200 |
| 4,481,577 | 11/1984 | Forson | 364/200 |
| 4,484,304 | 11/1984 | Anderson et al. | 364/900 |
| 4,502,128 | 2/1985 | Okajima et al. | 364/900 |
| 4,595,980 | 6/1986 | Innes | 364/200 |
| 4,597,057 | 6/1986 | Snow | 364/900 |

OTHER PUBLICATIONS

*IBM Technical Disclosure Bulletin*, vol. 27, No. 12, May 1985, pp. 6902–6903, "Vocabulary-Based Memory Compression".
*IBM Technical Disclosure Bulletin*, vol. 23, No. 9, Feb. 1981, pp. 4197–4198, "Message Compression Method".
*IBM Technical Disclosure Bulletin*, vol. 24, No. 9, Feb. 1982, pp. 4583–4584, "Message and Menu Tables Compaction/Compression".
*IBM Technical Disclosure Bulletin*, vol. 24, No. 1B, Jun. 1981, pp. 787–789, "Text Compaction By Word Mapping".
*IBM Technical Disclosure Bulletin*, vol. 25, No. 2, Jul. 1982, pp. 678–682, "Message Compression With Human-Readable Abbreviations".
*IBM Technical Disclosure Bulletin*, vol. 23, No. 2, Jul. 1980, pp. 448–452, "Diagramtic Text Compression".
*IBM Technical Disclosure Bulletin*, vol. 22, No. 1, Jun. 1979, pp. 389–390, "Data Compression System".
*IBM Technical Disclosure Bulletin*, vol. 21, No. 2, Jul. 1978, pp. 458–462, "Data Base Compression Through Combined Software Techniques".
*IBM Technical Disclosure Bulletin*, vol. 16, No. 8, Jan. 1974, pp. 2483–2486, "Data Compression Techniques for the Elimination of Repeating Byte Strings".
*IBM Technical Disclosure Bulletin*, vol. 20, No. 11B, Apr. 1978, p. 4941, "Dictionary Encoding Based on Zipf's Law".

*Primary Examiner*—Gareth D. Shaw
*Assistant Examiner*—Paul Kulik
*Attorney, Agent, or Firm*—Thomas E. Tyson

[57] ABSTRACT

A method for forming a file of messages for a computer program including the steps of first forming a first file portion as a message word table having entries corresponding to the message words, said entries ordered in the table by their frequency of occurrence in the messages. Then forming a second portion as a message token string table containing a token string for each message where each token string includes several tokens, each representing a word or variable in the message. The tokens are located in the string according to the location of the corresponding words in the message. Each token has a value that represents the location of its corresponding word in the message word table. The third step includes forming a third file portion as a message look-up table that contains a unique identifier for each message and a corresponding pointer that indicates the address of a token in the token string table. Also disclosed is a method of retrieving a message having a unique identifier that includes the step of first locating the identifier in a message look-up table portion of a message file and then retrieving a pointer that corresponds to the identifier. The pointer is used to locate the first token of a token string that represents the words and variables of a message. Each of the tokens is then used to access the message word table or is decoded to represent the variables, the words and variables are assembled in a buffer in the order of occurrence in the message token string to form an assembled or formatted message.

7 Claims, 3 Drawing Sheets

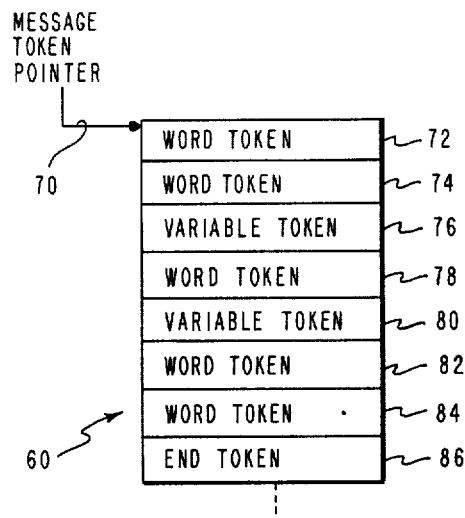
FIG. 7
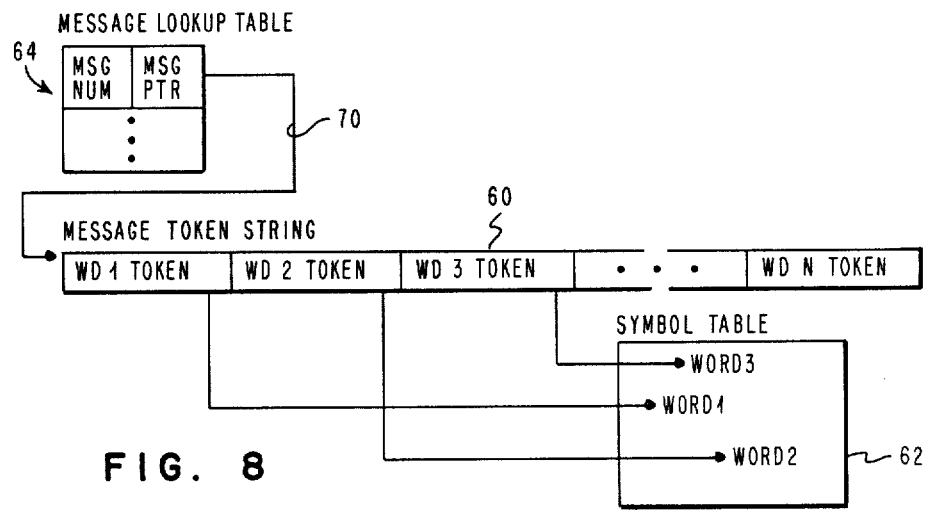
FIG. 8
| 72 | 74 | 76 | 78 | 80 | 82 | 84 |
|---|---|---|---|---|---|---|
| DEVICE | NUMBER | %1 | IS | %2 | ONLINE | OFFLINE |
FIG. 9

MESSAGE FILE FORMATION FOR COMPUTER PROGRAMS

TECHNICAL FIELD

This invention relates to computer programs and more specifically to forming message files that are contained within computer programs.

BACKGROUND ART

In order for a computer to communicate with an operator, a computer program often includes messages that are selectively displayed to the operator to communicate the requirement for further inputs or the results of some process. As computer programs tend to become more "user friendly", the number of messages employed by the program will increase in order to facilitate communications with the user. As the number of messages increase, the memory storage required by the computer program also increases. Therefore, there exists a need to efficiently provide messages to the user without overburdening the computer storage facilities.

A technique used for efficiently employing memory storage is data or text compression. One method of text compression is disclosed in the IBM Technical Disclosure Bulletin, Vol. 24, No. 1B, June, 1981, entitled "Text Compaction by Word Mapping", which discusses Huffman coding and a word mapping technique that is used to access letters or symbols efficiently when retrieving text.

A second technique is disclosed in the IBM Technical Disclosure Bulletin, Vol. 24, No. 9, Feb., 1982, entitled "Message and Menu Tables Compaction/Compression", that discloses a technique for accessing messages using character symbolic names. This technique uses several tables that define different attributes of each message. Compaction of the text is accomplished by recognizing redundancy of data in the messages and then providing the data only once in a table. The redundant data is represented by variable length code words.

Another message compression technique is disclosed in IBM Technical Disclosure Bulletin, Vol. 23, No. 9, Feb., 1981, entitled "Message Compression Method"- that discusses the use of local memory to store portions of compressed message symbol strings wherein special commands in the compressed message string provide an address to a pointer that points to a local memory location including the often used symbol or symbols.

A further message compression technique is disclosed in IBM Technical Disclosure Bulletin, Vol. 27, No. 12, May, 1985, entitled "Vocabulary-Based Memory Compression". This disclosure discusses the use of a read-only memory (or read-only storage) to store several universally used words. Additionally, the computer will include a random access memory (RAM) that is used to store words that are unique to a document to be provided by the computer. By providing the universally used words in ROM. These often used words do not have to be stored in RAM but may be recalled by the their ROM address. When a document is processed, this universal word memory is used to allow coding of the commonly used words. These codes require much less memory space than do the words themselves. Therefore, by using the universal word ROM, messages can be stored in less memory space than if the words were not encoded.

A further aspect of message file structure includes the requirement that the message file be easily accessible for translation when a program is to be used in foreign countries. In other words, the messages contained in the computer program should be easily accessible so that these words may be translated into corresponding words of a foreign language enabling computer operators in a foreign country to use the program.

The object of the present invention is to provide a method of forming message files to efficiently use computer memory while providing access to the words of the messages for language translation.

Another object of the present invention is to provide a method for reforming the messages stored in the message file structure described above.

DISCLOSURE OF THE INVENTION

In accordance with the present invention, a method for forming a data file of messages is provided. These messages are defined as including several text words in sequence and are to be stored in a computer program. The method consists of the steps of (1) forming a first file portion as a message word table that has entries that correspond to the message words. The entries are ordered in the table by their frequency of occurrence in the messages. The second step includes forming a second file portion as a message token string containing a token string for each message. Each token of the token string represents a word in the message and the tokens are ordered in a string by the location of their corresponding words in the sequence of the corresponding message. Each token includes a value that represents the location of its corresponding word in the message word table. The third step includes forming a third file portion as a message look-up table that contains a unique identifier for each message and a corresponding pointer. The corresponding pointer indicates the address of the token string for the corresponding message in the message token string table.

In the preferred embodiment, a unique method for building a compressed message file is provided. A message is defined as a sequence of words comprising information to be communicated from a program to a human operator. The unique method here described consists of building the compressed message file in three distinct parts.

The first part of the message consists of a table of words, (symbol table), comprising a single instance of each word contained in the file of message text. These words are ordered according to their frequency of occurrence in the message file.

The second part consists of a series of tokens for each message. This series of tokens is ordered in the same way as the words in the message that they represent. Besides showing the order of words in the message, a word token (representing a message word) also indicates whether the word is followed by a space or a non-space in the message, and a value that represents the location of the corresponding word in the symbol table described above. In addition to representing words in the message, a token may also be used as a placeholder for variable information to be inserted into a message immediately before a using program displays the message to the program user. This type of token indicates whether the variable is followed by a space or non-space in the message and what type of variable is to be provided by the program for insertion into the message. Allowable variable types are character string (i.e. a text word), an integer that must be converted from its computer internal form into a character string, or a ring, which is a set of predefined words, one of which will be selected by the program for insertion into the message immediately prior to displaying the message to the user. A special token is placed at the end of the message token string indicating the end of message has been reached.

The third part of the compressed message file consists of a table of entries (one for each message in the message file) each of which contains the message number of its corresponding message and the location in the compressed message file of the set of tokens describing the message.

All messages to be used by the program for display to an operator are initially placed in a source message file in a form easily used and modified by a human (i.e. in English or another country's language). This source message file can be easily translated from one language to another for use in countries other than those using the language in which the messages were originally written. When the source message file is completed (in the correct language), the source message file is processed by a program (message compiler) that builds a compressed message file in the form described above. This compressed message file (computer friendly rather than user friendly) is then distributed with the program for use in the country corresponding to the language used in the source message file. The source file can be translated into multiple languages, compiled for the respective language and distributed with the programs in the using country. Only the source message file need be modified and recompiled for different languages. Keeping all language dependent information in the message file obviates the need for modifying programs for use in multiple countries. In the message word table (or symbol table), each series of word characters includes a special terminating character to indicate the end of the word. The tokens in the token string indicate the location of the words in the message word table by containing a value which is the offset location of the word in the message word table. This value signifies the location of the corresponding word in double byte increments. Further, certain tokens contain only single bytes of information and correspond to the location of the more frequently used words in the message word table (i.e. those near the front of the table).

Another aspect of the preferred embodiment is the use of tokens to indicate the location of variables in the message string. These variables are defined by their tokens as being one of several different types. One type of token is termed a ring variable which is a variable that indicates one of a plurality of words. The ring variable token is contained in the token string and the words to be indicated by the ring variable are contained in the message word table and indicated by the corresponding word tokens in the token string adjacent to the ring variable token.

Also in the preferred embodiment is a method of retrieving a message having a unique identifier including the steps of locating the identifier in the message look-up table portion of the file and retrieving a pointer corresponding to the identifier. The pointer is then used to access the token string table to access the specific token string representing the message. Each token is then used to locate each word of the message in the message word table. The words are assembled in a buffer in the order of their corresponding token appearance in the token string. The assembled words in the buffers are then passed as the assembled message.

BRIEF DESCRIPTION OF THE DRAWING

The novel features believed characteristic of the invention are set forth in the appended claims. The invention itself, however, as well as other features and advantages thereof, will be best understood by reference to the following Best Mode for Carrying Out the Invention, when read in conjunction with the accompanying FIGS., wherein:

FIG. 7 is a diagram illustrating the contents of the message token string table;

FIG. 8 is a diagram illustrating the interrelationship between the message look-up table, the message token string table, and the message symbol table; and FIG. 9 is a diagram illustrating a message containing a ring variable.

BEST MODE FOR CARRYING OUT THE INVENTION

The present invention addresses the problem of providing efficient storage of messages used by computer programs. This present invention provides a mechanism to effectively provide the message object file in a compact or compressed manner to save computer memory while still providing access to the words in the messages to enable the translation of these message words into a foreign language.

Figure 1:
FIG. 1 is a block diagram illustrating the compilation of a message source file into a compressed message object file.

FIG. 1 is a block diagram illustrating the compilation of a message source file. In the present invention, all the messages are in a file labeled message source file 10. The message source file 10 is then compiled by a compiler 12 to provide the object code. Specifically, the object code for the message file is contained in the message object file 14.

Figure 2:
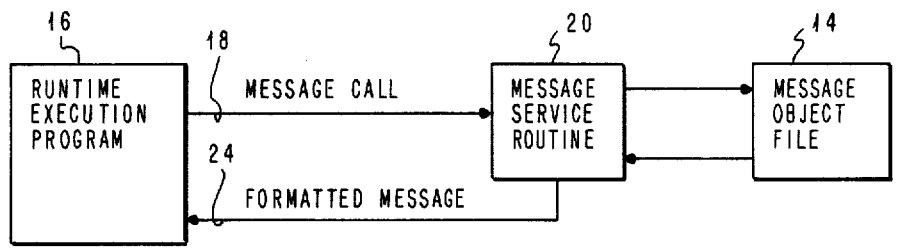
FIG. 2 is a block diagram illustrating the formatting of a message from the message object file.

FIG. 2 illustrates the formatting of the message during the run-time execution of the program using the message object file. Specifically, the application program is referred to in FIG. 2 as the run-time execution program 16. This run-time execution program 16 issues a message call 18 to a message service routine 20. The message service routine accesses the message object file 14. The message service routine 20 then provides the formatted message 24 back to the run-time execution program 16. As previously discussed, this formatted message would often appear on a display or some output to an operator to communicate either a request for further input or the result of some process to this operator.

Figures 5, 6:
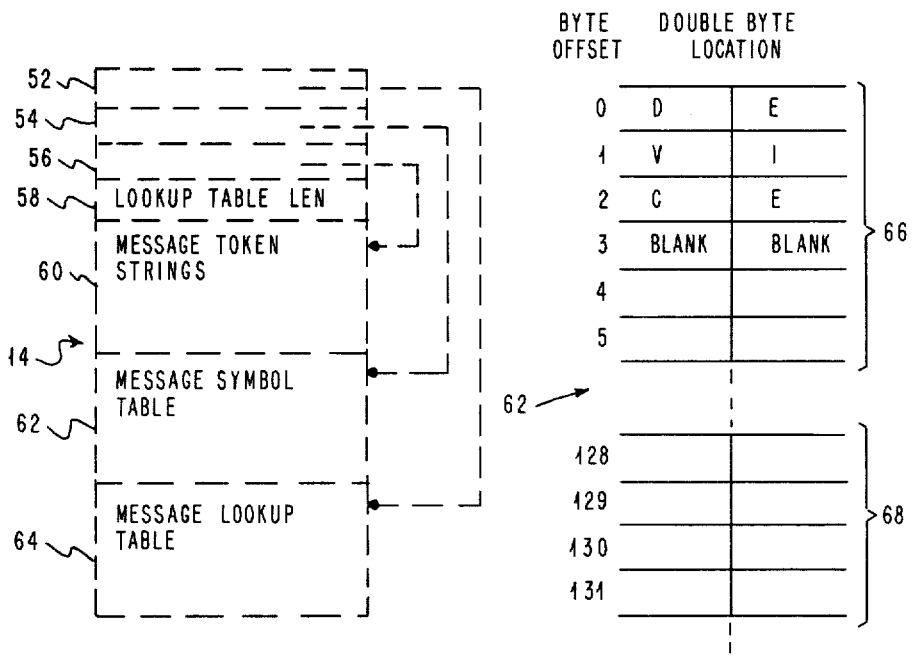
FIG. 5 is a block diagram illustrating the internal contents of a message object file.
FIG. 6 is a diagram illustrating the contents of the message symbol table.
Figure 3:
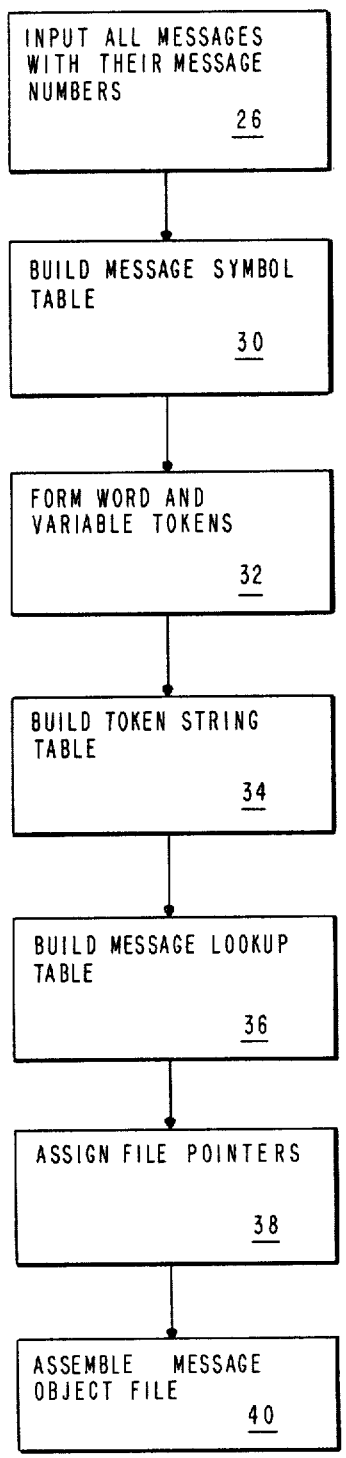
FIG. 3 is a block flow chart illustrating the formation or compilation of a message object file.

FIG. 3 illustrates the process of forming the message object file 14 through use of the compiler 12. First, all messages and their associated message numbers are input in block 26. The messages are assembled from their source code. Table 2 illustrates an example of source code that defines a message and variable. The message source reads "Device number %1 is %2". %1 is an integer as illustrated. This integer defines the integer number for the device in the message. %2 defines the second variable which, from the source code, is a ring variable that is to specify either "on-line" or "off-line". The message symbol table is then constructed in step 30. The construction of the message symbol table includes the forming of a table of one instance of each word contained in all messages in order starting with the most frequently used word in the messages to the least frequently used word in the messages. The Message Source File is available for translation to any foreign language. Each of these messages is translated and assembled to form a new Message Source File of messages for that foreign language. This new Message Source File can then be compiled by compiler 12 (FIG. 1) to form a new message object file optimized for that foreign language. FIG. 6 illustrates a diagram of a message symbol table. In portion 66 of the message symbol table 62, the word "DEVICE" is contained. Note that the table is organized in double byte increments containing one letter for each byte. Additionally, the end of the word is terminated with a blank. Since the table includes double byte increments, and since the word "DEVICE" contains an even number of letters, the entry of the word device in table 62 requires that it be terminated by two blank bytes as illustrated. The words in the message symbol table are accessed by their byte offset as shown. Therefore, a single byte (from 0 to 127) will locate words contained in the first 128 double byte locations in the message symbol table.

After all of the words have been placed in the message symbol table 62, the tokens for the words and variables are then formed in step 32 of FIG. 3. Table 1 illustrates the tokens. A word may be represented by either a short word token or a long word token. A short word token provides the offset of a word within the first 128 double byte locations in the message symbol table. A long word token is required for accessing all words in an offset position beyond 128 double byte positions in the message symbol table. The long word token includes a 13 bit half-word offset plus a code bit S that indicates whether there is a trailing space or no trailing space. Note that in the short word token, a trailing space is mandatory. In other words, if a word in a message is not followed by a space, it cannot be represented by a short word token.

Variables contained in the messages are also designated with tokens. A short variable token includes the indication of the variable type and the variable number. The variable type represents an indication of whether the variable is an integer, a string of data, the time, the date, or a ring variable. Note that a ring variable cannot be represented by a short variable token. It can only be represented by a long variable token. The long variable token further includes an indication of trailing space and, for a ring variable, the number of ring members. The contents of a ring variable will be explained later. Also note, that if the variable is not followed by a space, it cannot be represented by a short variable token. The last type of token in Table 1 is the end-of-message token. This token designates the end of the token string. Note that the bit values of all short and long tokens and the end-of-message token are unique. By using the tokens, the words in a message can be encoded in a manner that provides the efficient use of computer memory.

Returning to FIG. 3, in step 34 the token string table is built. This is accomplished by taking each message and encoding the words and variables of the message as tokens and assembling these tokens in an order that represents the corresponding order of the words and variables in the message. These token strings are then assembled into the token string table. The location of the first token in each token string of the token string table is then combined with the message number. The combination of message numbers and their corresponding message token string pointers are then assembled into the message look-up table in step 36. In step 38, three pointers 52, 54 and 56 (FIG. 5) are provided. In FIG. 5, the message object file 14 is illustrated as including the message token string table 60, the message symbol table 62 and the message look-up table 64. These three tables are pointed to by pointers 52, 54 and 56 which each represent the first location of each table in memory. These pointers are assigned in step 38 and stored accordingly. Additionally, the length of the message look-up table 64 is stored in location 58 in memory. In step 40, the pointers 52, 54, and 56, the look-up table length 58, and the message token string table 60, message symbol table 62, and the message look-up table 64 are assembled to form the message object file.

Figure 4:
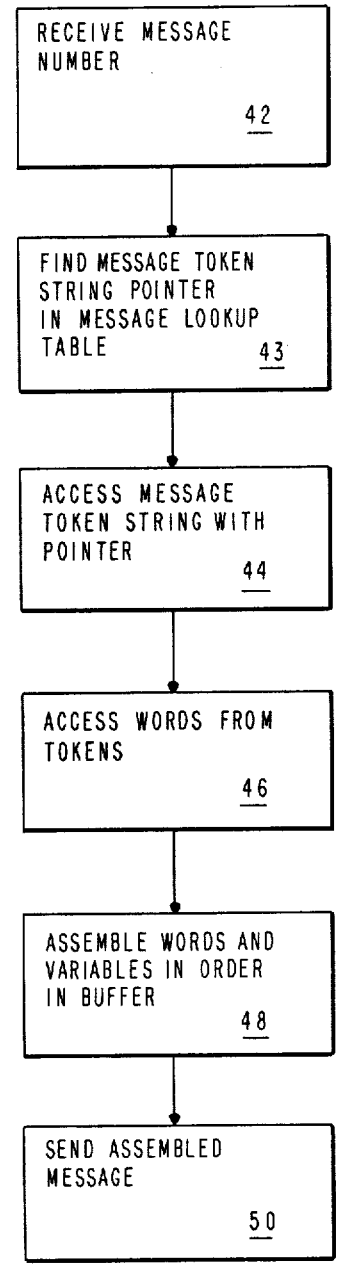
FIG. 4 is a block flow chart illustrating the formatting of a message from the message object file.

FIG. 4 is a flow chart illustrating the process of FIG. 2, formatting a message. In FIG. 4, the message service routine 20 first receives the message number through a message call. Table 3 illustrates the message call statement in the program source code. Note that the message call statement requires that the program provide the name of the message object file, the message number, the variable pointers, the buffer where the formatted message is to be placed, and the length of the caller's message buffer. In step 43, the message number is used to access the message token string pointer in the message look-up table 64. The message service routine 20 (FIG. 2) then accesses the words of the message symbol table 62 using the tokens pointed to by the message token string pointer. In step 48, the accessed words and variables are then assembled in order in a buffer specified by the executing program 16. These words are assembled in the order that is dictated by the order of their corresponding tokens of the token string. The assembled words in the buffer are then sent in step 50 to the run-time execution program 16 as a formatted message.

FIG. 8 illustrates in a symbolic form the accessing of the words in the message symbol table 62 through a message string in table 60 from the message look-up table 64. In FIG. 8, the message pointer 70 in the message look-up table 64 is used to access the first word of the token string in the message token string table 60. Each token is used to access words in the message symbol table 62.

FIG. 7 illustrates the content of a token string in the message token string table 60. In FIG. 7, the message token pointer 70 indicates the address of the first word token 72 in the message token string of the message token string table 60. Each token is arranged in the sequence of its corresponding word or variable in the message. In FIG. 7, the order is ascending from word token 72 through variable token 76 to the end token 86. The end token designates the end of the token string.

FIG. 9 illustrates the message of Table 2. FIG. 9 contains reference numbers that correspond to the token table illustrated in FIG. 8. Therefore, token 72 references the word "DEVICE" and the message symbol table 62 (FIG. 5) likewise token 74 references the word "NUMBER". Token 76 is a variable token that is defined in table 2 as an integer number. The word "IS" is represented by word token 78. Token 80 is a variable number 2 that is defined as a ring variable in Table 2. The ring variable has two possible values, "ON-LINE", and "OFF-LINE". These two words are represented by tokens 82 and 84 in the token string of FIG. 7. Note that these are word tokens, even though referenced by a ring variable and will reference words stored in the message symbol table 62. The value of the ring variable represented by token 80 will be furnished by the run-time execution program 16 (FIG. 2) during run-time execution through the message call statement (Table 3) and will specify which of the ring words is to be provided in the assembled message (either 1 or 2).

Although the invention has been described in reference to this specific embodiment, this description is not meant to be construed in a limiting sense. Various modifications of the disclosed embodiment, as well as other embodiments of the invention, will become apparent to those skilled in the art upon reference to the description of this invention. It is, therefore, contemplated that the appended claims will cover any such modifications or embodiments as fall within the true scope of the invention.

TABLE I

| Type | TOKENS Value | Width | Definition |
|---|---|---|---|
| Short Word Token | 0-X'7F' | 1 byte | Half word offset into the message symbol table |
| Long Word Token | 11sx xxxx xxxx xxxx | 2 bytes | x = 13 bit half word offset into the message symbol table<br>s = trailing space indicator<br>0 = insert trailing space<br>1 = no trailing space |
| Short Variable Token | 10tt tnnn | 1 byte | t = variable type (integer, string, time, date) - see long variable token -<br>n = variable number<br>0-7 = numbers 1-8 |
| Long Variable Token | 10tt tnnn xxsx rrrr | 2 bytes | t = variable type<br>Integer = 000<br>String = 001<br>Time = 010<br>Date = 011<br>Ring = 100<br>(only in long variable token)<br>n = variable number<br>0-7 = numbers 1-8<br>s = no trailing space indicator<br>r = number of ring members |

Note: The long ring variable token is distinguished from a long integer variable token by testing the number of ring variables for > zero. If > zero, TABLE I-continued

| Type | TOKENS Value | Width | Definition |
|---|---|---|---|
| | the variable is a ring, if not, an integer. | | |
| End of Message Token | X'BF' | byte | |

TABLE II

MESSAGE SERVICES MESSAGE SOURCE EXAMPLE

Source example:
vars = I;
vars = R, "online offline";
text = 123, "Device number %1 is %2";

Note: The above source would comprise a message source file with only one message. This source file would be compiled into an object message file via msgan1 command.

TABLE III

SYNOPSIS OF "SQLOGMSG" TO FORMAT AND OBTAIN A MESSAGE FOR OUTPUT

Call Statement
int sqlogmsg (filespec,msgno,varptr,buffer,bufleng)
char filespec[ ];
unsigned msgno;
int *varptr[ ];
char *buffer[ ];
int bufleng;
DESCRIPTION
This function obtains a description of the requested message from secondary storage, formats and inserts variables passed via the sqlogmsg call and returns the formatted message to the call.
PARAMETERS

| filespec | name of the file containing the callers message object library. If not in the current directory, it is the fully qualified name of the file including device and path. |
|---|---|
| msgno | number of the requested message. |
| varptr | pointer to an array of pointers to insert variables. The variable formats pointed to are as follows:<br>Integer variables are two byte integer.<br>Ring variables are two byte integer (1-7) to indicate ring word to be selected.<br>String is a two byte length followed by the string data. |
| buffer | pointer to the caller's buffer where formatted message is to be placed. |
| bufleng | length of the caller's message buffer in bytes. |

RETURN VALUE
Upon successful completion, the function value will contain the actual length of the formatted message. If the formatted message is larger than the caller's buffer, the message is truncated to the caller's buffer length. The actual size of the full formatted message is returned as the return value. If an error occurs, a negative return value from a list of errors will be returned.

We claim:

1. In a computer program containing a plurality of messages, each including a plurality of text words, a method for forming a data file of the messages comprising the steps of:
    forming a first file portion as a message word table having unique entries corresponding to one or more of the message words, said entries ordered in said table in accordance with their frequency of occurrence in the plurality of messages;

forming a second file portion as a message token string table containing a token string for each message, each token string including a plurality of tokens each representing a word in the message, said tokens ordered in the string by the location of their corresponding words in the corresponding message, each token having a value representing the location of its corresponding word in the message word table, said tokens including at least one token to indicate the location of a variable in the message, said variable having a value being defined when the message is retrieved and wherein said variable includes a ring variable type indicating one of a plurality of values, said values stored as words in the message word table and indicated in said token string as a plurality of corresponding tokens following a token representing the ring variable, a specific value of a selected variable being provided when the message is retrieved; and forming a third file portion as a message lookup table containing a unique identifier for each message and a corresponding pointer, said pointer indicating an address of the token string for the corresponding message.

2. A method according to claim 1 wherein the message lookup table pointer indicates an address of a first token of the token string.

3. A method according to claim 2 wherein each of said token strings is terminated by a token indicating an end of the token string.

4. A method according to claim 3 wherein said tokens include an indication of a terminating space.

5. A method according to claim 4 wherein said word entries each include a terminating user specified character.

6. A method according to claim 5 wherein said words are stored in two byte increments in the message word table.

7. A method according to claim 6 wherein said single and double data lengths are single byte and double byte lengths, said single byte lengths tokens indicating words within a first plurality of double byte locations in the message word table.

* * * * *

UNITED STATES PATENT AND TRADEMARK OFFICE
CERTIFICATE OF CORRECTION

PATENT NO. : 4,949,302

DATED : August 14, 1990

INVENTOR(S) : Hugh H. Arnold et al

It is certified that error appears in the above-identified patent and that said Letters Patent is hereby corrected as shown below:

Col. 10, line 20, before 'tokens' delete "lengths" and insert --length--.

Signed and Sealed this

Nineteenth Day of May, 1992

Attest:

DOUGLAS B. COMER

Attesting Officer

Acting Commissioner of Patents and Trademarks